United States Patent [19]
Kim et al.

[11] Patent Number: 5,225,698
[45] Date of Patent: Jul. 6, 1993

[54] SEMI-CONDUCTOR DEVICE WITH STACKED TRENCH CAPACITOR

[75] Inventors: Seong-tae Kim; Su-han Choi; Jae-hong Ko, all of Seoul, Rep. of Korea

[73] Assignee: Samsung Electronics Co., Inc., Rep. of Korea

[21] Appl. No.: 780,864

[22] Filed: Oct. 21, 1991

Related U.S. Application Data

[62] Division of Ser. No. 494,322, Mar. 16, 1990, Pat. No. 5,066,608.

[30] Foreign Application Priority Data

Aug. 12, 1989 [KR] Rep. of Korea ............... 89-18187

[51] Int. Cl.⁵ .................. H01L 29/68; H01L 29/78; H01L 29/94
[52] U.S. Cl. ................... 257/303; 257/301; 257/622
[58] Field of Search ............ 357/23.6, 23.6 G; 257/301, 303

[56] References Cited

U.S. PATENT DOCUMENTS 5,021,842  6/1991  Koyanagi ............ 357/23.6 G
5,027,172  6/1991  Jeon .................. 357/23.6 G
5,066,609  11/1991  Yamamoto ........... 357/23.6 G
5,089,868  2/1992  Motonami ............ 257/303

Primary Examiner—Rolf Hille
Assistant Examiner—Robert Limanek

[57] ABSTRACT

A semiconductor device and a manufacturing method therefor are disclosed, the semiconductor device including a field oxide layer selectively formed on a semiconductor substrate for defining an active region; an electrically insulated gate electrode; a source and a drain region; a trench formed in the semiconductor substrate; an impurity-doped region formed at the surface of the trench; a first insulating layer; a second conductive layer; a dielectric film; a third conductive layer; a fourth conductive layer; an etch blocking layer; a fifth conductive layer. The manufacturing method comprises a plurality of processes for forming the above mentioned parts by applying various processes. According to the present invention, as both the impurity-doped polycrystalline silicon layer of the upper portion of the transistor and the inside of the trench including the impurity-doped region are simultaneously used as the first electrode of the capacitor, the surface area of the capacitor electrode can be made larger.

7 Claims, 8 Drawing Sheets

SEMI-CONDUCTOR DEVICE WITH STACKED TRENCH CAPACITOR

This is a divisional of co-pending application Ser. No. 07/494,322 filed Mar. 16, 1990 now U.S. Pat. No. 5,066,608.

FILED OF THE INVENTION

The present invention relates to a semiconductor device and a manufacturing method therefor, and particularly to a semiconductor device and a manufacturing method therefor, in which the capacitance of a memory device can be maximized.

BACKGROUND OF THE INVENTION

Recently, with the progress of semiconductor manufacturing techniques and with the expansion of the application of semiconductor, a memory devices of large capacities are developed and promoted. Particularly, DRAM (Dynamic Random Access Memory) having the advantage of very-large-scale integration (VLSI) by combining into one memory cell one capacitor and one transistor has been considerably developed.

This type of DRAM applies the 4M DRAM by arranging the three dimensional structure having a stack type capacitor cell and a trench type capacitor cell instead of a prior planar type capacitor cell in the memory cell structure, but becomes difficult to apply to a 16M DRAM. Also, in the above stack type capacitor cell, step coverage problems occur owing to the capacitor structure stacked on the transistor, and in the trench type capacitor cell, leakage current problems between trenches occur during the scale down process. As the result, this type of DRAM is difficult to apply to a 64M DRAM.

Therefore, to sole the problem of this large capacity DRAM, a stack-trench combined type capacitor as a new three dimensional structure has been proposed, which is shown in FIG. 1.

Referring to FIG. 1 wherein a conventional stack-trench combined type capacitor is shown, an active region is defined by growing a field oxide layer 101 on the semiconductor substrate 100 and a first conductive layer such as an impurity-doped first polycrystalline silicon layer, namely, gate electrode 2, is formed on the active region by interpositing the gate oxide layer 1, and then, a first conductive layer 5, e.g., an impurity-doped first polycrystalline silicon layer, is formed on the field oxide layer 101 in such a manner that the first conductive layer is connected with a gate electrode of an adjacent memory cell. Thereafter, a source region 3 and a drain region 4 are formed on the semiconductor substrate surface of both sides of the gate electrode 2, and a first insulating layer 6 is formed on the entire surface of the structure as described above.

Through the application of a mask on the first insulating layer 6 and between the field oxide layer 101 and the gate electrode 2, a trench is formed in the semiconductor substrate 100, and then, a first electrode pattern which is formed by a second conductive layer 12b, e.g., an impurity-doped second polycrystalline silicon layer, is formed on both the inside of the trench 10 and the first insulating layer 6. Here, the second conductive layer 12b is used as a first electrode of the capacitor. Then, a dielectric film 14 covering the surface of the first electrode pattern is formed, and then, a third conductive layer 15, e.g., an impurity-doped third polycrystalline silicon layer is formed on the entire surface of the above described structure, so that the third conductive layer 15 is used as a second electrode of the capacitor, thereby forming the stack-trench combined type capacitor.

Since the prior stack-trench combined type capacitor descried above in detail as shown in FIG. 1 directly forms the second conductive layer used as the first electrode of the capacitor on the inside of the trench, the surface area of the trench gets small. When the capacitor is formed by forming the dielectric film and the third conductive layer on the small surface, i.e., the surface of the trench in turn, the problem of capacitance loss arises.

SUMMARY OF THE INVENTION

It is an object of the present invention to provide a stack-trench combined type capacitor for increasing the capacitance by using the surface of the trench formed in the semiconductor substrate as the first electrode of the capacitor.

It is another object of the present invention to provide a manufacturing method which is suitable for manufacturing the stack-trench combined type capacitor having the above mentioned structure in an effective manner.

To accomplish the above objects, a stack-trench combined type capacitor according to the present invention is characterized by comprising a field oxide layer which is selectively formed to define an active region on the semiconductor substrate of a first conductivity type, a gate electrode of the fist conductive layer electrically insulated on the active region, a source and a drain region of a second conductivity type formed at the both sides of the gate electrode and on the semiconductor substrate surface, a trench formed in the semiconductor substrate and within the source region, an impurity-doped region of the second conductivity type formed at the surface of the trench for connecting to the source region, a first insulating layer for insulating the first conductive layer, a second conductive layer formed for connecting to the impurity-doped region through a part of the source region on the first insulating layer, a dielectric film formed on both the second conductive layer and the inside of the trench including the impurity-doped region, a third conductive layer having an etch blocking layer and a fourth conductive layer and formed on the dielectric film, and a fifth conductive layer formed to cover the third conductive layer and the fourth conductive layer.

The method suitable for manufacturing the above described structure of capacitor is characterized by providing a first process in order to define an active region by growing a field oxide layer on the semiconductor substrate of the firs conductivity type, a second process forming a gate electrode of a first conductive layer, a source and a drain region of a second conductivity type on the active region and forming a first insulating layer on the above obtained sample, a third process forming an opening to expose a portion of the source region, a fourth process forming a first electrode pattern by depositing a second polycrystalline silicon layer on both the first insulating layer and the entire surface of the substrate exposed, a fifth process forming a mask by depositing a second insulating layer on the first electrode pattern, a sixth process forming a trench in the semiconductor substrate and within the source region by applying the mask, a seventh process doping an impurity of the second conductivity type at both the first electrode pattern and the semiconductor substrate of the inside of the trench, an eighth process forming a dielectric film on both an impurity-doped first electrode pattern and the inside of the trench including the impurity-doped region, a ninth process depositing a third conductive layer, an etch blocking layer and a fourth conductive layer on the dielectric film in turn, and a tenth process depositing a fifth conductive layer after planarizing the sample obtained by the above processes.

BRIEF DESCRIPTION OF THE DRAWINGS

The above objects and other advantages of the present invention will become more apparently by describing in detail the preferred embodiment of the present invention with reference to the attached drawing in which.

DESCRIPTION OF A PREFERRED EMBODIMENT

Figure 1:
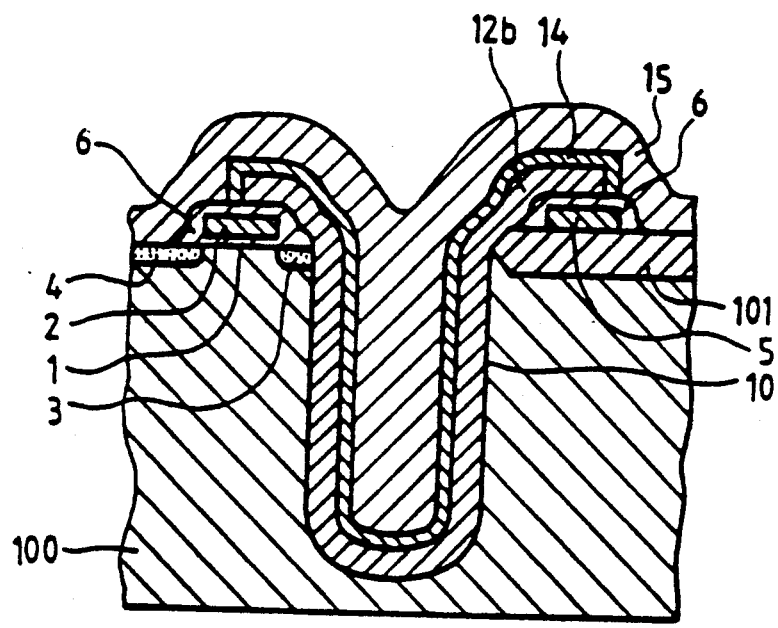
FIG. 1 is a cross-sectional view of the conventional stack-trench combined type capacitor.
Figure 2:
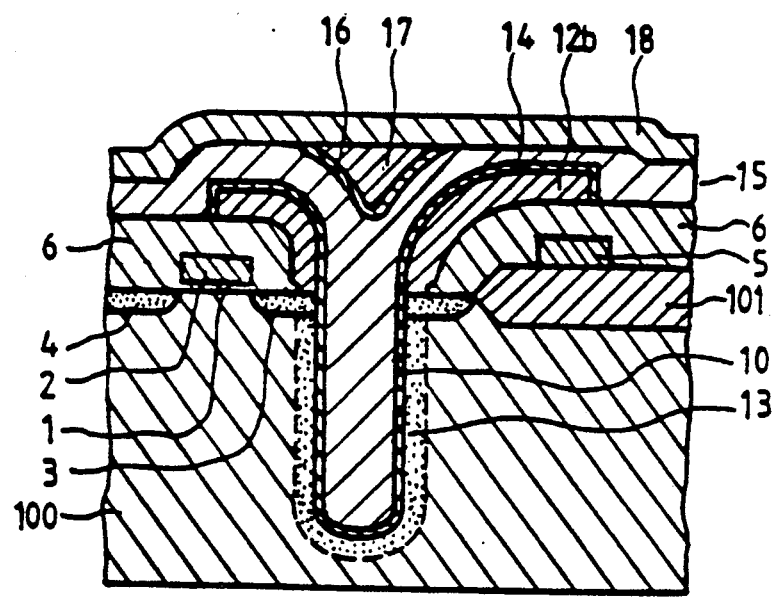
FIG. 2 is a cross-sectional view of the stack-trench combined type capacitor according to the present invention.

The stack-trench combined type capacitor according to the present invention as shown in FIG. 2 is manufactured in such a manner that field oxide layer 101 is selectively formed in order to define an active region on the semiconductor substrate 100 of a first conductivity the, and then, a gate electrode 2 is formed on the above active region by interpositing the gate oxide layer 1. Thereafter, a source and a drain region of a second conductivity type is formed on the semiconductor substrate surface and at both sides of the gate electrode 2.

A first conductive layer 5 is formed on any predetermined portion of the field oxide layer 101 in such a manner that the first conductive layer is connected with a gate electrode of an adjacent memory cell. A trench 10 is formed in the semiconductor substrate and within the source region 3 and an impurity-doped region of a second conductivity type is formed at the surface of the trench 10 in order to connect the source region. A first insulating layer 6 is formed on both the gate electrode 2 and the first conductive layer 5.

A second polycrystalline silicon layer doped by an impurity of the second conductivity type is formed on the first insulating layer 6 of the upper part of the gate electrode 2 and the first conductive layer 5 in order to connect the impurity-doped region 13 through a part of the source region. Thereafter, a dielectric film 14 is formed on both the second polycrystalline silicon layer 12b and the inside of the trench formed the impurity-doped region 13. A planarized third conductive layer 15 having an etch blocking layer 16 and a fourth conductive layer 17 is formed on the dielectric film 14, and a fifth conductive layer 18 is formed on the entire surface of the above-described structure, thereby completing the manufacturing of the stack-trench combined type capacitor according to the present invention.

FIGS. 3A to 3K are sectional views showing sequentially one manufacturing method for the stack-trench combined type capacitor according to the present invention.

Figure 3A:
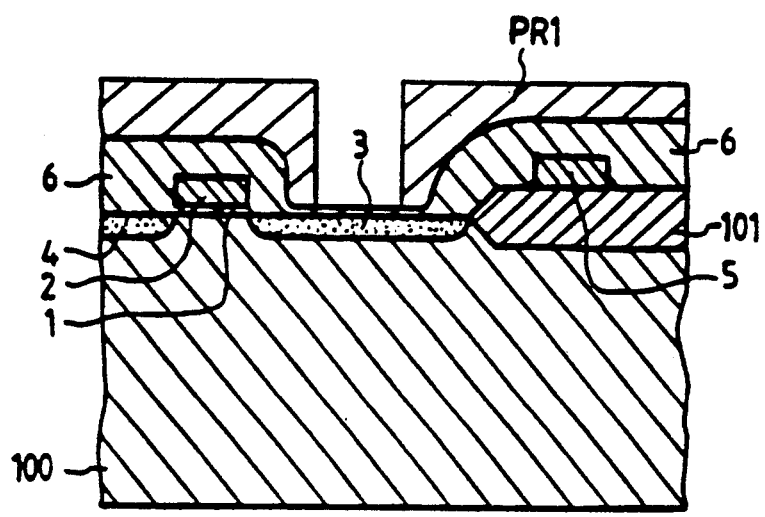
FIGS. 3A to 3K show the manufacturing processes of one embodiment for the stack-trench combined type capacitor according to the present invention.

FIG. 3A illustrates the formation process of a transistor and a first photoresist pattern PR1 on the semiconductor substrate 100. In the process of FIG. 3A, first of all, a field oxide layer is grown to define an active region by the selective oxidation process on the first conductivity type, e.g., P-type semiconductor substrate 100. Thereafter, a gate oxide layer 1 having a thickness of approximately 100A 200A is formed on the active region.

A first conductive layer which becomes the gate electrode 2 of the transistor, such as an impurity-doped first polycrystalline silicon layer, is formed on the gate oxide layer 1, and simultaneously, a first conductive layer 5 is formed on any predetermined portion of the field oxide layer 101 in such a manner that the first conductive layer is connected with a gate electrode of an adjacent memory cell. A source region 3 and a drain region 4 are formed through the ion implantation of $N^+$ impurities of a second conductivity type on the surface of the semiconductor substrate and at the both sides of the gate electrode 2. A first insulating layer 6 is formed on the entire surface of the above-described structure. Thereafter, a first photoresist pattern PR1 is formed in order to expose a part cf the source region through processes such as photoresist coating, mask exposure, development, etc., on the first insulating layer 6.

Figure 3B:
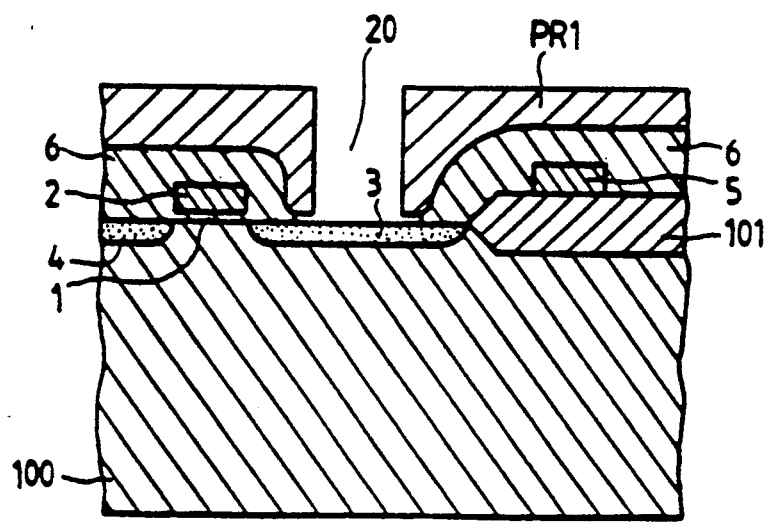

FIG. 3B illustrates the formation process of an opening 20 through an etching process. In the process of FIG. 3B, with the application of the first photoresist pattern PR1, the first insulating layer 6 on the source region is etched through a wet etching process or a wet-dry combined etching process, and therefore, a portion of the source region 3 is exposed Owing to occurrence of horizontal etching during the above etching process, the first insulating layer 6 is overetched to the inside in comparison with the actual dimensions of the first photoresist pattern PR1, and therefore, an opening 20 is formed as shown in FIG. 3B.

Figure 3C:
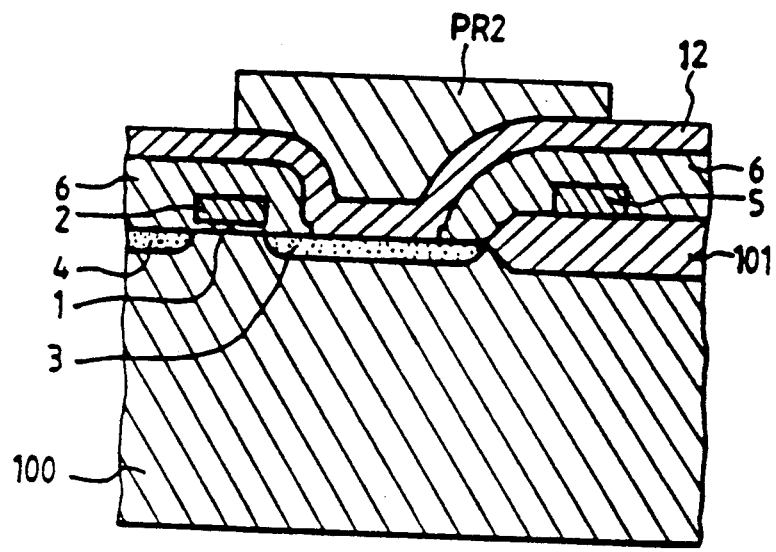

FIG. 3C illustrates the formation process of a second polycrystalline silicon layer used as a first electrode of the capacitor and a second photoresist pattern PR2. In the process of FIG. 3C, after removing the first photoresist pattern, the second polycrystalline silicon layer 12 is deposited on both the first insulating layer 6 and the entire surface of the exposed substrate. Thereafter, through processes such as photoresist coating, mask exposure, development, etc., on the second polycrystalline silicon layer 12, a second photoresist pattern PR2 is formed in order to overlap a part of the gate electrode 2 and the first conductive layer 5.

Figure 3D:
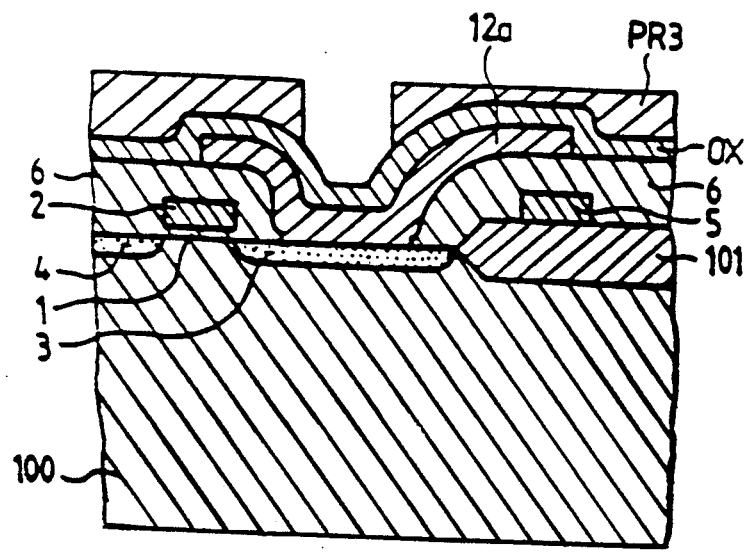

FIG. 3D illustrates the formation process of a first electrode pattern 12a, a second insulating layer OX and a third photoresist pattern PR3. In the process of FIG. 3D, with the application of the second photoresist pattern, a first electrode pattern 12a of the capacitor is formed through the etching of the second polycrystalline silicon layer, and then, a second insulating layer OX such as an LTO (Low Temperature Oxide) layer or an HTO (High Temperature Oxide) layer is deposited in order to cover the first electrode pattern 12a.

Thereafter, through processes such as photoresist coating, mask exposure, development, etc. on the second insulating layer OX, a third photoresist pattern PR3 is formed in order to expose the second insulating layer OX on the source region. Here, the dimension of the third photoresist pattern PR3 is manufactured to be same as or smaller than the critical dimension of the first photoresist pattern.

Figure 3E:
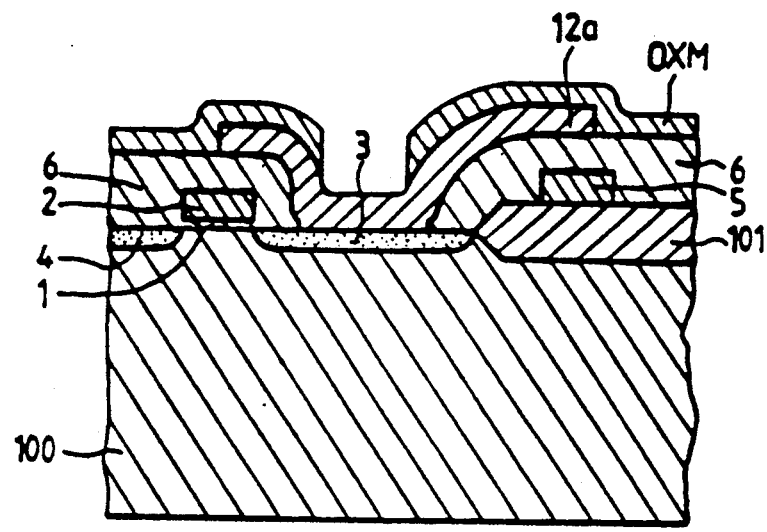

FIG. 3E illustrates the formation process of a mask OXM for the purpose of forming the trench. In the process of FIG. 3E, the second insulating layer is etched by applying the third photoresist pattern, and the mask OXM used to form pattern.

Figure 3F:
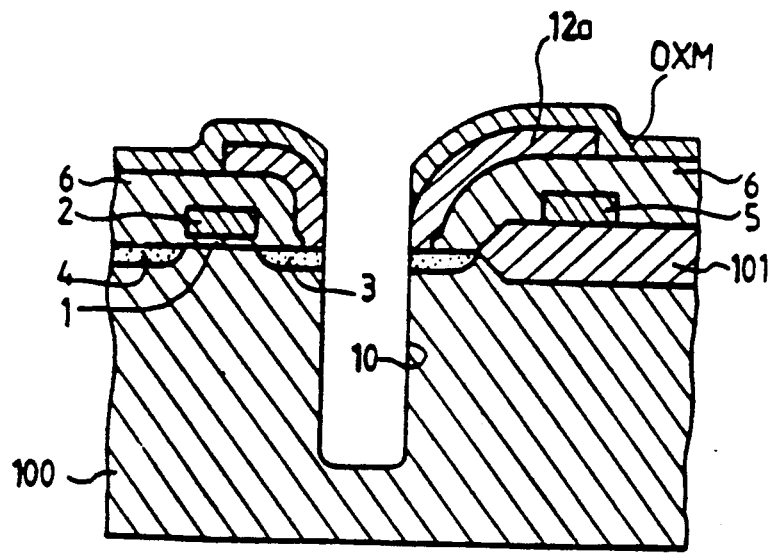

FIG. 3F illustrates the formation process of a trench In the process of FIG. 3F, a trench 10 is formed in the semiconductor substrate within the source region by applying the mask OXM on the second insulating layer.

Figure 3G:
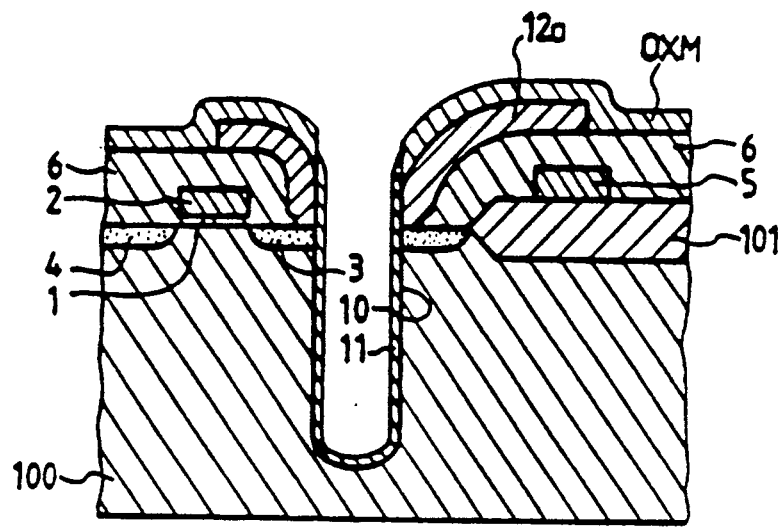

FIG. 3G illustrates the formation process of a sacrificial oxide layer 11. In the process of FIG. 3G, a sacrificial oxide layer 11 having the thickness of approximately 100A 300A is formed through thermal oxidation on both sides of the first electrode pattern 12a and the inside of the trench 10 by using the second insulating layer used as the mask OXM in the process of forming the trench in order to round the shear corner region of the trench. Here, the second insulating layer is utilized as the seed in order to form the sacrificial oxide layer 11. Also, owing to the formation of the sacrificial oxide layer 11, the surface damage of the semiconductor substrate can be removed which is produced in the process of forming the trench 10.

Figure 3H:
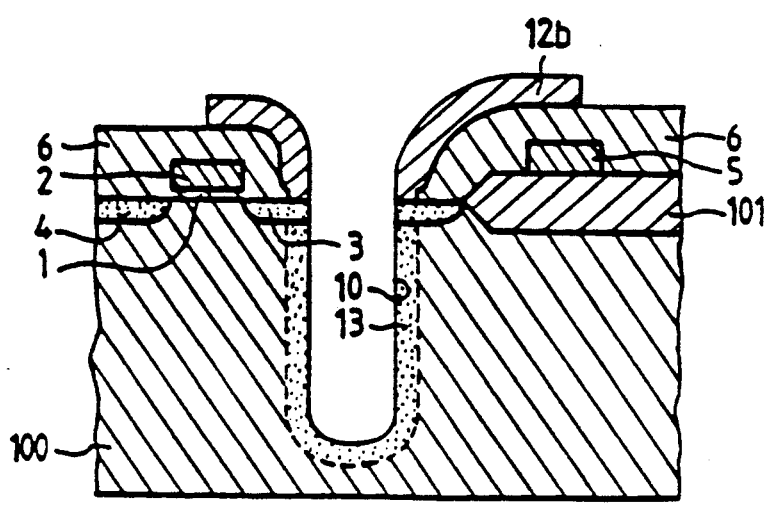

FIG. 3H illustrates the formation process of impurity doping. In the process of FIG. 3H, after removing the above mask and the sacrificial oxide layer by means of a BOE (Buffered Oxide Etch), N+type impurity of the second conductivity type such as POCl$_3$, or P, or As, etc. is doped into both the second polycrystalline silicon layer of the first electrode pattern and the semiconductor substrate of the inside of the trench by means of impurity-diffusion or ion implantation. Owing to direct connecting the impurity-doped second polycrystalline silicon layer 12b with the impurity-doped region formed at the surface of the trench 10 through a part of the N+ the source region which is formed by overetching the first insulating layer of FIG. 3B, the above impurity-doped second polycrystalline silicon layer 12b and the above impurity-doped region 13 are used as the first electrode of the capacitor.

Figure 3I:
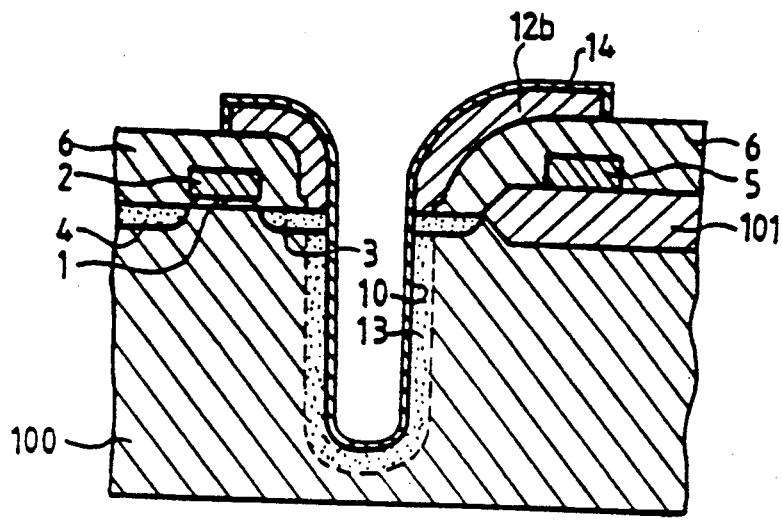

FIG. 3I illustrates the formation process of a dielectric film 14. In the process of FIG. 3I, a first oxide layer having the thickness of approximately 10A-60A such as an HTO layer or an LTO layer is deposited on both the impurity-doped second polycrystalline silicon layer 12b and the inside of the trench 10 including the impurity-doped region 13. Thereafter, a nitride layer having the thickness of approximately 50A-150A is formed on the first oxide layer during the flowing of NH$_3$ gas by means of the LPCVD (Low Pressure Chemical Vapor Deposition) technique, and then, the dielectric film 14 of the ONO structure, i.e., Oxide layer/Nitride layer-/Oxide layer structure is formed by growing a second oxide layer having the thickness of approximately 10A-60A on the nitride layer. Here, as an HTO layer or an LTO layer is used as the lower oxide layer of the dielectric In having ONO structure, a uniform oxide layer can be obtained which is not affected by the doped level and kind of the substrate on which the oxide layer is formed. In other words, uniform oxide layer can be obtained on both the impurity-doped second polycrystalline silicon layer 12b and the inside of the trench 10 including the impurity-doped region 13 by simultaneously depositing the oxide layer such as an HTO layer or an LTO layer. Also, the characteristics of the dielectric film can be improved by manufacturing the nitride layer having a multi-layer structure among the dielectric film of the ONO structure.

Figure 3J:
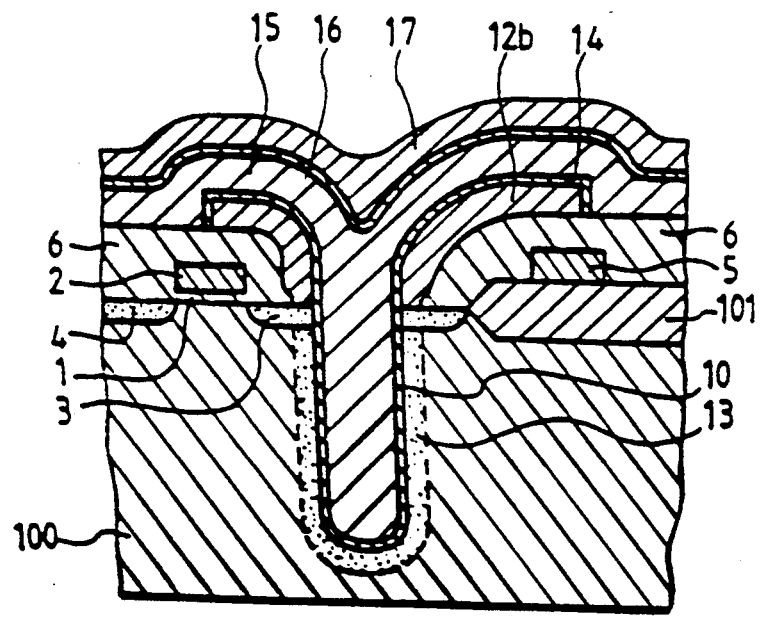

FIG. 3J illustrates the formation process of a third conductive layer 15, an etch blocking layer 16 and a fourth conductive layer 17. In the process of FIG. 3J, the interior of the trench is filled with a third conductive layer used as the first layer of the second electrode of the capacitor, e.g., an impurity-doped third polycrystalline silicon layer on the dielectric film 14. Thereafter, after thinly depositing an etch blocking layer 16 of an LTO layer or an HTO layer on the third conductive layer 15 in order to remove defects which produce voids in the interior of the trench during the fill-up, the voids produced in the interior of the trench are removed by continuing to form the fourth conductive layer 17, e.g., an impurity-doped fourth polycrystalline silicon layer.

Figure 3K:
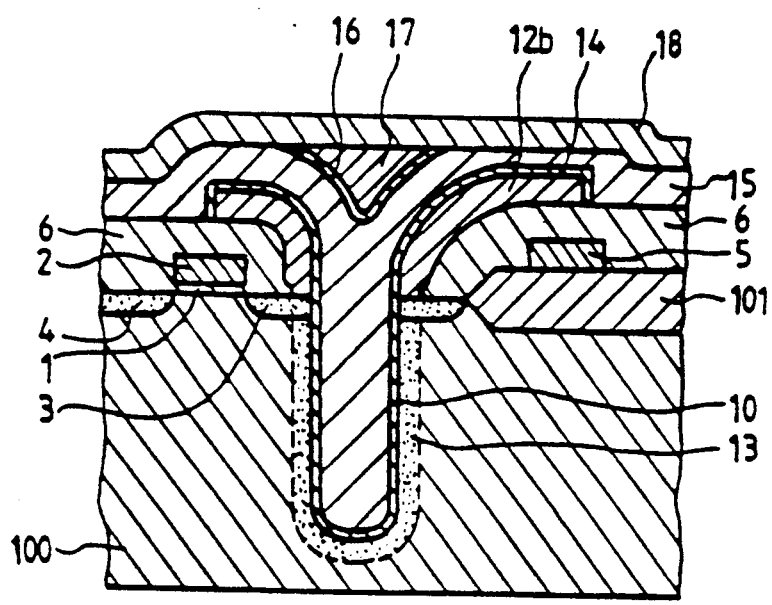

FIG. 3K illustrates the formation process of a fifth conductive layer 18 after planarize the surface of the sample obtained by the above described processes. In the process of FIG. 3K, in order to planarize the surface after forming the fourth conductive layer 17, an etchback process is carried out until the etch blocking layer 16 is exposed, and the etch blocking layer 16 exposed from the etching process is removed by BOE Thereafter, the stack-trench combined type capacitor is completed by depositing a fifth conductive layer 18 used as the second layer of the second electrode of the capacitor such as the fifth polycrystalline silicon layer doped by impurities According to the present invention as described above, as both the impurity-doped polycrystalline silicon layer of the upper portion of the transistor and the inside of the trench including the impurity-doped region are simultaneously used as the first electrode of the capacitor, the surface area of the capacitor electrode can be made larger than that of the capacitor electrode which was made by using the conductive layer formed in the inside of the trench as the first electrode of the capacitor in prior art, therefore a capacitor having a large capacitance can be obtained.

Additionally, the break-down phenomena of the dielectric film due to the local electric field at the boundary of the polycrystalline silicon and the single crystalline silicon and the non-uniformity of the dielectric film by each differently growing thickness of the oxide layer on the polycrystalline silicon and the single crystalline silicon can be prevented by using an HTO layer or an LTO layer as the lower oxide layer of the dielectric film having ONO structure.

Further, by forming in turn the etch blocking layer and the fourth conductive layer on the third conductive layer used as the first layer of the second electrode of the capacitor, the voids produced in the interior of the trench during the formation of the third conductive layer can be removed Therefore, the reliability and the electrical characteristics of capacitor can be improved

What is claimed is:

1. A semiconductor device, comprising:
 a field oxide layer selectively formed to define an active region on a semiconductor substrate of a first conductivity type;
 a gate electrode of the first conductive layer electrically insulated on said active region;
 a source region and a drain region of a second conductivity type formed on the surface of said semiconductor substrate and at both sides of said gate electrode;

a trench formed in said semiconductor substrate within said source region;

an impurity-doped region of said second conductivity type formed at the surface of said trench to be connected to said source region;

a first insulating layer for insulating said first conductive layer;

a second conductive layer formed to be connected to said impurity-doped region through a part of said source region on said first insulating layer;

a dielectric film formed on both said second conductive layer and the inside of said trench including said impurity-doped region;

a third conductive layer formed on said dielectric film to fill said trench;

an etch blocking layer formed on said third conductive layer and a fourth conductive layer formed on said etch blocking layer, said etch blocking layer being used in an etch back process for forming said fourth conductive layer, and both said etch blocking layer and said fourth conductive layer being formed at a center portion of said trench, thereby removing the voids produced in the interior of said trench; and a fifth conductive layer formed to cover said third conductive layer and said fourth conductive layer such that said fourth conductive layer is electrically connected to said third conductive layer via said fifth conductive layer.

2. The semiconductor device as claimed in claim 1, wherein said first, second, third, fourth and fifth conductive layers are impurity-doped polycrystalline silicon layers.

3. The semiconductor device as claimed in claim 1, wherein the impurities of said second conductive layer and said impurity-doped region are chosen from the group $POCl_3$, P, and As.

4. The semiconductor device as claimed in claim 1, wherein said dielectric film has an oxide layer/nitride layer/oxide layer structure.

5. The semiconductor device as claimed in claim 4, wherein a lower oxide layer of said dielectric film having an oxide layer/nitride layer/oxide layer structure is made of a high or low temperature oxide layer.

6. The semiconductor device as claimed in claim 5, wherein, said lower oxide layer has the thickness of 10A–60A.

7. The semiconductor device as claimed in claim 1, wherein, said etch blocking layer is made of a high temperature oxide layer or a low temperature oxide layer.

* * * * *